United States Patent
Zdebel et al.

(10) Patent No.: US 6,809,396 B2
(45) Date of Patent: Oct. 26, 2004

(54) INTEGRATED CIRCUIT WITH A HIGH SPEED NARROW BASE WIDTH VERTICAL PNP TRANSISTOR

(75) Inventors: Peter J. Zdebel, Austin, TX (US);
Misbahul Azam, Gilbert, AZ (US);
Gary H. Loechelt, Tempe, AZ (US);
James R. Morgan, Chandler, AZ (US);
Julio C. Costa, Greensboro, NC (US)

(73) Assignee: Semiconductor Components Industries, L.L.C., Phoenix, AZ (US)

(*) Notice: Subject to any disclaimer, the term of this patent is extended or adjusted under 35 U.S.C. 154(b) by 0 days.

(21) Appl. No.: 10/303,168

(22) Filed: Nov. 25, 2002

(65) Prior Publication Data

US 2004/0099896 A1 May 27, 2004

(51) Int. Cl.[7] ................ H01L 29/73; H01L 27/082; H01L 27/102
(52) U.S. Cl. ................ 257/511; 257/555; 257/593
(58) Field of Search ................ 257/47, 197, 205, 257/273, 350, 361, 370, 378, 423, 462, 477, 478, 479, 511, 512, 517, 518, 525, 526, 539–543, 552–593

(56) References Cited

U.S. PATENT DOCUMENTS

| | | | |
|---|---|---|---|
| 4,997,776 A | * | 3/1991 | Harame et al. ............. 438/313 |
| 5,026,663 A | * | 6/1991 | Zdebel et al. ............. 438/556 |
| 5,086,005 A | * | 2/1992 | Hirakawa ............. 438/339 |

* cited by examiner

*Primary Examiner*—Long Pham
*Assistant Examiner*—Marcos D. Pizarro-Crespo
(74) *Attorney, Agent, or Firm*—James J. Stipanuk; Kevin B. Jackson

(57) ABSTRACT

An integrated circuit (100) includes high performance complementary bipolar NPN and PNP vertical transistors (10, 20). The NPN transistor is formed on a semiconductor substrate whose surface (24) is doped to form a PNP base region (28, 70). A film (32, 34, 30) is formed on the surface with an opening (42) over an edge of the base region. A first conductive spacer (48) is formed along a first sidewall (78) of the opening to define a PNP emitter region (67) within the base region. A second conductive spacer (47) is formed along a second sidewall (76) of the opening to define a PNP collector region (66).

8 Claims, 4 Drawing Sheets

INTEGRATED CIRCUIT WITH A HIGH SPEED NARROW BASE WIDTH VERTICAL PNP TRANSISTOR

BACKGROUND OF THE INVENTION

The present invention relates in general to semiconductor devices and, more particularly, to high frequency and analog integrated circuits made with bipolar transistors.

Many analog integrated circuits are fabricated with bipolar transistors because of their characteristic low noise operation as well as high gain and frequency response. For example, receiver circuits in wireless communications devices typically operate at frequencies of 2.4 gigahertz or more and require a high voltage gain and low noise. In many cases, integrated circuits having bipolar transistors are the preferred choice for these applications.

Most bipolar integrated circuits are optimized to produce high performance vertical NPN transistors. The complementary PNP transistors are available, but typically only as lateral devices whose base width is limited to the minimum feature size of the process. Because they have long base widths, such lateral PNP transistors operate with a low frequency response. Some integrated circuits provide vertical PNP transistors, but these devices have collectors that are formed in a grounded substrate, and therefore are usable only as emitter followers. Vertical PNP transistors having independent, unconnected collectors usually require numerous costly processing steps that result in too high a fabrication cost for many applications.

Hence, there is a need for an integrated circuit that provides both high performance NPN and PNP transistors and which can be manufactured at a low cost.

DETAILED DESCRIPTION OF THE DRAWINGS

In the figures, elements having the same reference number have similar functionality. Note that a number of specific processing steps utilized to form the structures shown in the figures are omitted in order to simplify the description and better explain the invention. Many of these steps are described in detail in U.S. Pat. No. 6,387,768, entitled "Method of Manufacturing a Semiconductor Component and Semiconductor Component Thereof", issued on May 14, 2002, to Kurt Sakamoto, inventor.

Figure 1:
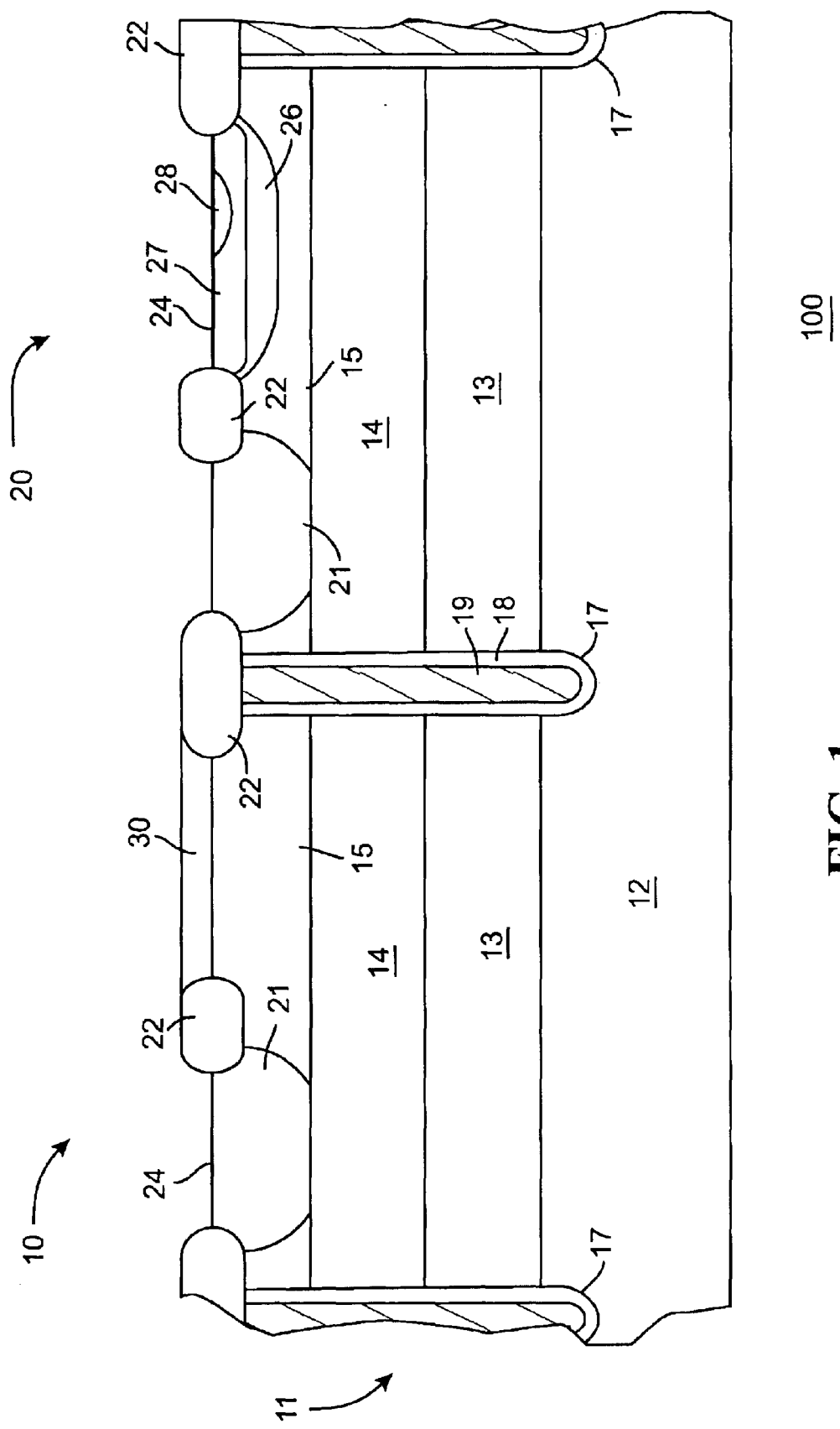
FIG. 1 is a cross-sectional view of an integrated circuit after a first fabrication stage.

FIG. 1 is a cross-sectional view of an integrated circuit 100 after a first stage of fabrication. Integrated circuit 100 includes a heterojunction bipolar NPN transistor 10 and a vertical PNP transistor 20 formed on a semiconductor substrate 11 and isolated from each other, and from other devices (not shown), by a plurality of trenches 17. In one embodiment, substrate 11 is formed with monocrystalline silicon and integrated circuit 100 comprises an analog high frequency amplifier circuit operating at a frequency greater than about 2.4 gigahertz.

A base layer 12 is heavily doped to provide a low resistance ground plane for high frequency signals flowing through transistors 10 and/or 20. In one embodiment, base layer 12 comprises monocrystalline silicon doped to have a p-type conductivity and a resistivity of about 0.1 ohm-centimeters.

An epitaxial layer 13 is grown on base layer 12 to have a p-type conductivity and a relatively high resistivity. The high resistivity provides a low parasitic substrate capacitance for transistors 10 and 20, which increases the overall frequency response of integrated circuit 100. In one embodiment, epitaxial layer 13 has a thickness of about 2.75 micrometers and a doping concentration of about $10^{14}$ atoms/centimeter$^3$.

A buried layer 14 is formed over epitaxial layer 13 to provide a low collector resistance for NPN transistor 10 and a low base resistance for PNP transistor 20. In one embodiment, buried layer 14 is implanted to have an n-type conductivity, a thickness of about one micrometer and a doping concentration of about $6.0*10^{19}$ atoms/centimeter$^3$.

An epitaxial layer 15 is grown over buried layer 14 to a thickness of about 0.8 micrometers. In one embodiment, epitaxial layer 15 has an n-type conductivity and a doping concentration of $2.0*10^{16}$ atoms/centimeter$^3$, approximately.

A plurality of trenches 17 are etched to a depth sufficient to reach base layer 12 in order to form electrically isolated islands that enclose portions of epitaxial layers 13 and 15 and buried layer 14. In one embodiment, trenches 17 are formed to a depth of about six micrometers. Surfaces of trenches 17 are lined with a dielectric layer 18 and then filled with a conformal material 19. In one embodiment, dielectric layer 18 is thermally grown silicon dioxide, and conformal material 19 includes undoped polycrystalline silicon.

Surface 24 is patterned and a dielectric material is selectively formed on a surface 24 to produce shallow local isolation regions 22. In one embodiment, isolation regions 22 are formed with a thermally grown silicon dioxide.

Surface 24 is further patterned to mask dopants introduced into epitaxial layer 15 to form doped regions 21, which diffuse during subsequent thermal cycles to extend into buried layer 14. Doped regions 21 form part of the collector of NPN transistor 10 and/or to bias regions of epitaxial layer 15 in order to allow the collector of PNP transistor 20 to float. Regions 21 typically are heavily doped to provide low resistance paths from surface 24 to buried layer 14. In one embodiment, doped regions 21 are formed with an n-type conductivity and an effective doping concentration on the order of about $2.0*10^{18}$ atoms/centimeter$^3$.

The PNP collector is formed with a deep collector 26 and a shallow collector 27. Deep collector 26 is more heavily doped than shallow collector 27 in order to provide a low PNP collector resistance while maintaining a high collector-base breakdown voltage and good control over the depth of subsequent diffusions. In addition, the lighter doping of shallow collector 27 provides a low collector-base junction capacitance and a high Early voltage, which increase the voltage gain and maximum operating frequency of transistor 20. In one embodiment, deep collector 26 is formed with a high energy implant step that centers dopants at a depth of about 0.6 micrometers and drives them in to a depth of about 0.8 micrometers with a doping concentration of about $5*10^{18}$ atoms/centimeter$^3$. Shallow collector 27 is formed to a depth of about 0.4 micrometers and a doping concentration of about $10^{17}$ atoms/centimeter$^3$.

A PNP base 28 is formed within shallow collector 27 and doped to have an n-type conductivity. In one embodiment, base 28 is formed with a depth of about 0.2 micrometers and a doping concentration of about $5*10^{18}$ atoms/centimeter$^3$.

An NPN base region 30 is formed over surface 24 to have a p-type conductivity. In one embodiment, base region 30 is formed by selectively depositing silicon-germanium as an epitaxial layer having a p-type conductivity and a doping concentration of about $2.0*10^{19}$ atoms/centimeter$^3$. The upper portion of region 30 is grown without dopants or germanium to provide a thin monocrystalline silicon layer for forming the emitter of NPN transistor 10. In one embodiment, this upper portion has a thickness of about four hundred angstroms.

Figure 2:
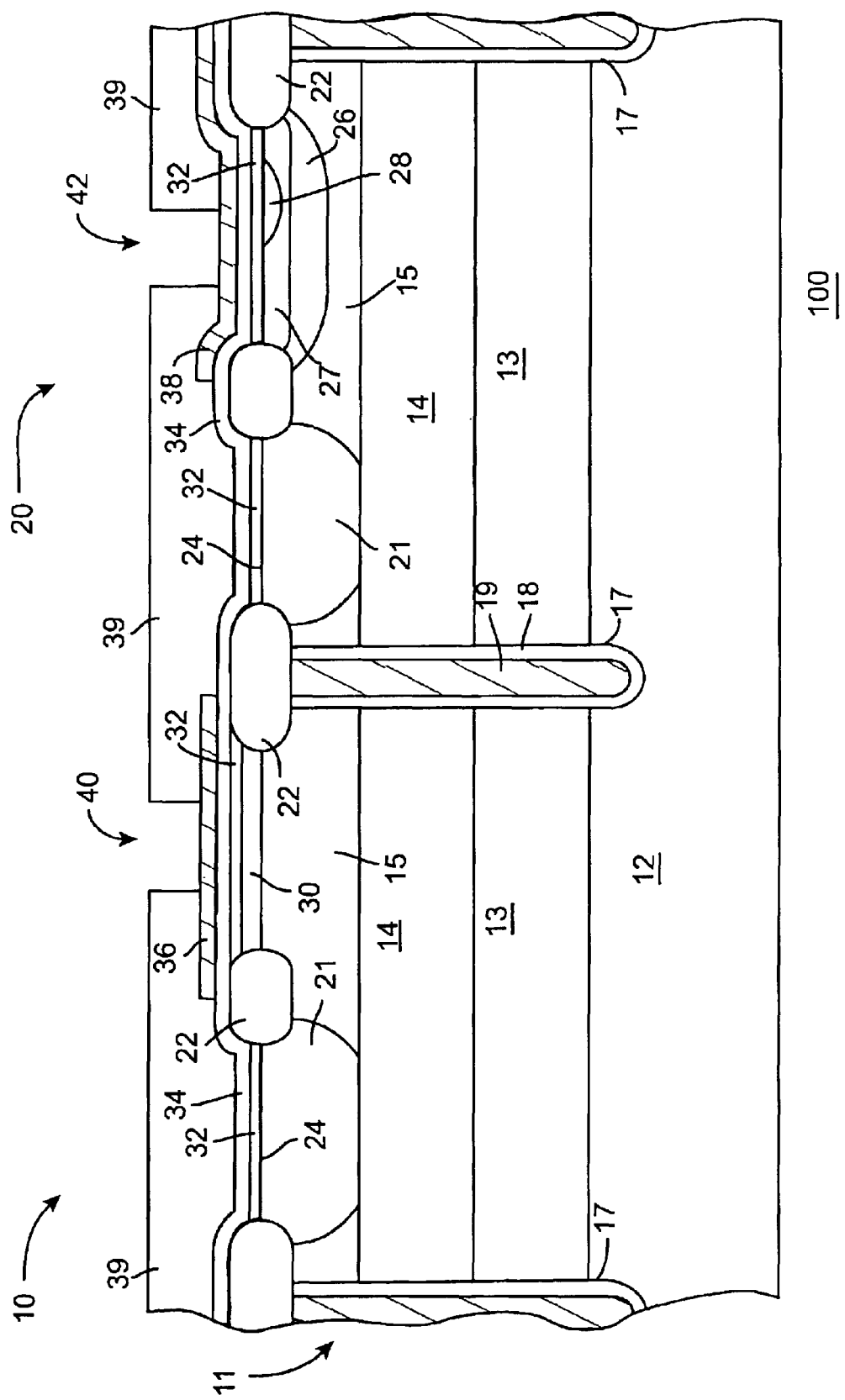
FIG. 2 is a cross-sectional view of the integrated circuit after a second fabrication stage.

FIG. 2 is a cross-sectional view of integrated circuit 100 after a second stage of fabrication.

A dielectric material is selectively formed on surface 24 to produce a dielectric film 32. In one embodiment, dielectric film 32 comprises a thermally grown silicon dioxide layer formed with a typical thickness of about one hundred angstroms.

A dielectric material is then deposited over dielectric film 32 to produce a dielectric film 34. In one embodiment, dielectric film 34 comprises a deposited silicon nitride formed to a thickness of about one thousand angstroms.

A conductive film is formed over dielectric film 34 and patterned to produce an NPN base electrode 36 and a PNP conductive film 38. In one embodiment, base electrode 36 and conductive film 38 comprise polycrystalline silicon formed to a thickness of about one thousand eight hundred angstroms and heavily doped to provide a p-type conductivity.

A dielectric material is then deposited on integrated circuit 100 to produce a dielectric film 39. In one embodiment, dielectric film 39 comprises silicon dioxide deposited to a thickness of about one micrometer and subjected to a planarization etchback to leave a final thickness of about six thousand angstroms.

Dielectric film 39 is patterned and etched to produce an opening 40 that exposes base electrode 36 and an opening 42 that exposes conductive film 38.

Figure 3:
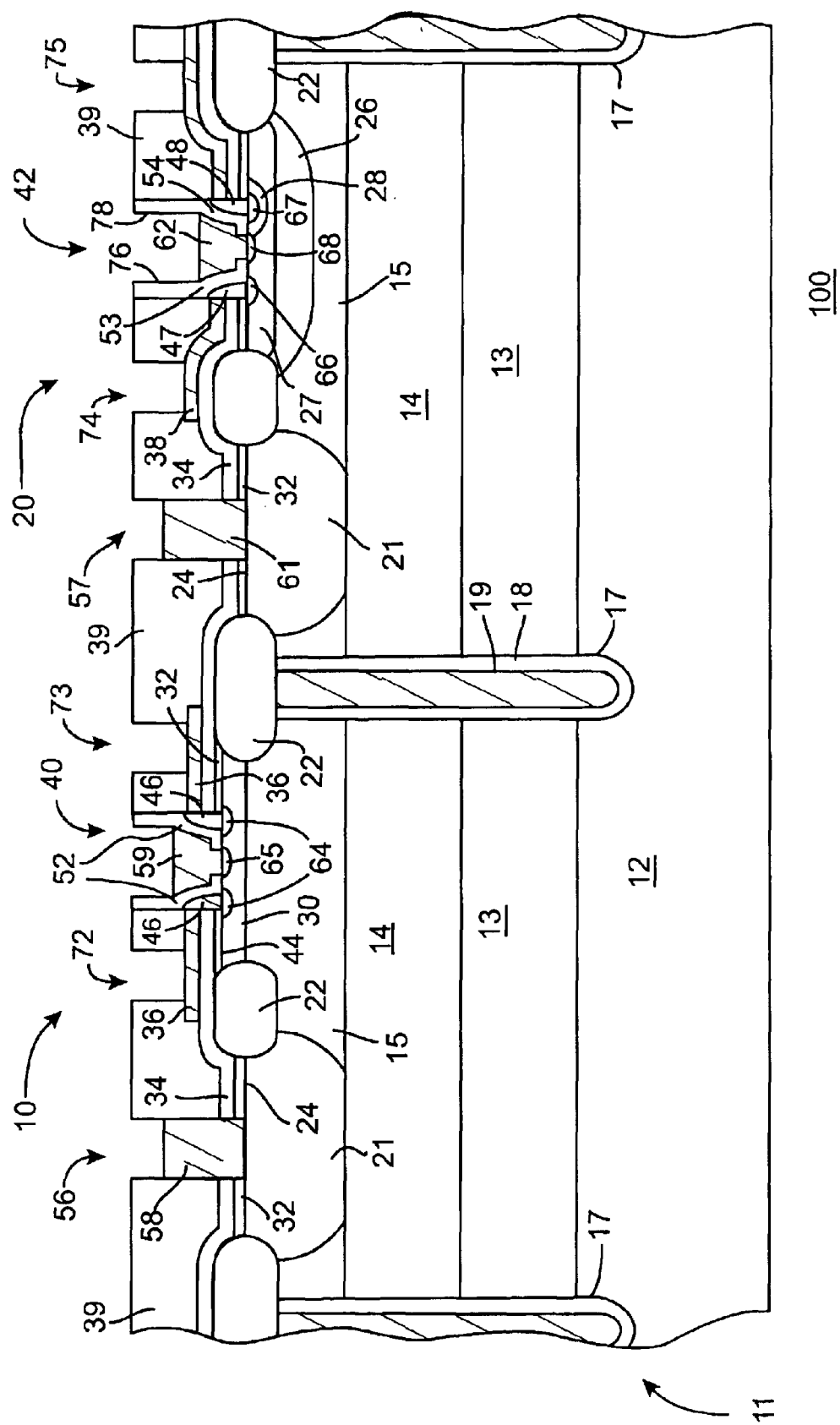
FIG. 3 is a cross-sectional view of the integrated circuit after a third fabrication stage.

FIG. 3 shows a cross-sectional view of integrated circuit 100 after a third stage of fabrication.

A sequence of standard etch steps removes material from portions of dielectric films 32 and 34, base electrode 36 and conductive film 38 that are exposed in openings 40 and 42. The result of these etching steps is to expose surface 24 through opening 42 and a surface 44 of base region 30 through opening 40. Opening 40 thereby defines a contact window in base electrode 36 and opening 42 separates the portion of conductive film 38 formed within PNP transistor 20 into a PNP collector electrode 38A and a PNP emitter electrode 38B.

A conductive material is deposited on exposed surfaces of integrated circuit 100 and anisotropically etched to produce conductive spacers 46 along sidewalls of opening 40 and conductive spacers 47–48 along sidewalls 76 and 78 of opening 42. Spacers 46 are overetched so that their height extends from surface 44 to electrically contact base electrode 36. Spacers 47–48 are overetched to reduce their height to a level just above the level of electrodes 38A and 38B, respectively. Hence, spacers 47–48 form an electrical connection with electrodes 38A and 38B. Such overetching reduces parasitic electrode capacitances and also avoids device failures due to electrode shorting from film thinning over the vertical steps formed at the upper corners of openings 40 and 42.

A dielectric material and a sequence of other films are deposited and selectively etched to form dielectric spacers 52 in NPN transistor 10 and 53–54 in PNP transistor 20 as shown. In one embodiment, spacers 52–54 comprise silicon nitride deposited to a thickness of about one thousand angstroms.

Integrated circuit 100 is then patterned and etched to form an NPN collector window 56 and a PNP window 57 for contacting epitaxial layer 15. A semiconductor material is deposited and a planarization etchback or similar process removes portions of the semiconductor material. For NPN transistor 10, the etchback leaves a first portion of the semiconductor material within window 56 as an NPN collector electrode 58 and a second portion within opening 40 as an NPN emitter electrode 59. For PNP transistor 20, the etchback process leaves a first portion within window 57 as a PNP biasing electrode 61 and a second portion within opening 42 as a PNP base electrode 62. In one embodiment, the semiconductor material comprises polycrystalline silicon heavily doped to provide an n-type conductivity and a low resistance.

A subsequent thermal cycle results in the outdiffusion of dopants from the conductive and semiconductor materials contacting surfaces 24 and 44. In particular, for NPN transistor 10, p-type dopants from spacers 46 diffuse through surface 44 into base region 30 to form p-type NPN base contact regions 64, and n-type dopants diffuse from emitter electrode 59 to form an n-type emitter region 65 as shown. Base contact regions 64 and emitter region 65 typically are formed to a depth of about 0.1 micrometers below surface 44.

Similarly, for PNP transistor 20, p-type dopants from spacers 47–48 diffuse through surface 24 into shallow collector 27 to form a collector contact region 66 and into base 28 to form a PNP emitter 67, respectively, as shown. N-type dopants from base electrode 62 diffuse into shallow collector 27 to contact an edge of base 28, thereby forming a low resistance n-type base contact region 68 as shown. Collector contact region 66, PNP emitter 67 and base contact region 68 typically are formed to a depth of about 0.1 micrometers below surface 24. Such shallow regions result in low junction capacitances, a low stored charge from injected minority carriers and a high frequency response. Moreover, the performance of PNP transistor 20 can be optimized by tailoring the doping profile of base 28 with little or no modification of the processing steps used to form NPN transistor 10. Hence, integrated circuit 100 achieves a high frequency performance and low manufacturing cost while providing the advantages of both complementary NPN and PNP vertical transistors.

A photoresist step patterns integrated circuit 100 and exposed films are selectively etched to produce openings 72–75 for electrically contacting NPN base electrodes 36 and PNP collector and emitter electrodes 38A and 38B, respectively. Subsequent interconnect metallization layers, interlayer dielectric films, passivation films and the like are applied in a standard fashion and are not specifically illustrated in order to simplify the description and more clearly describe the invention.

Figure 4:
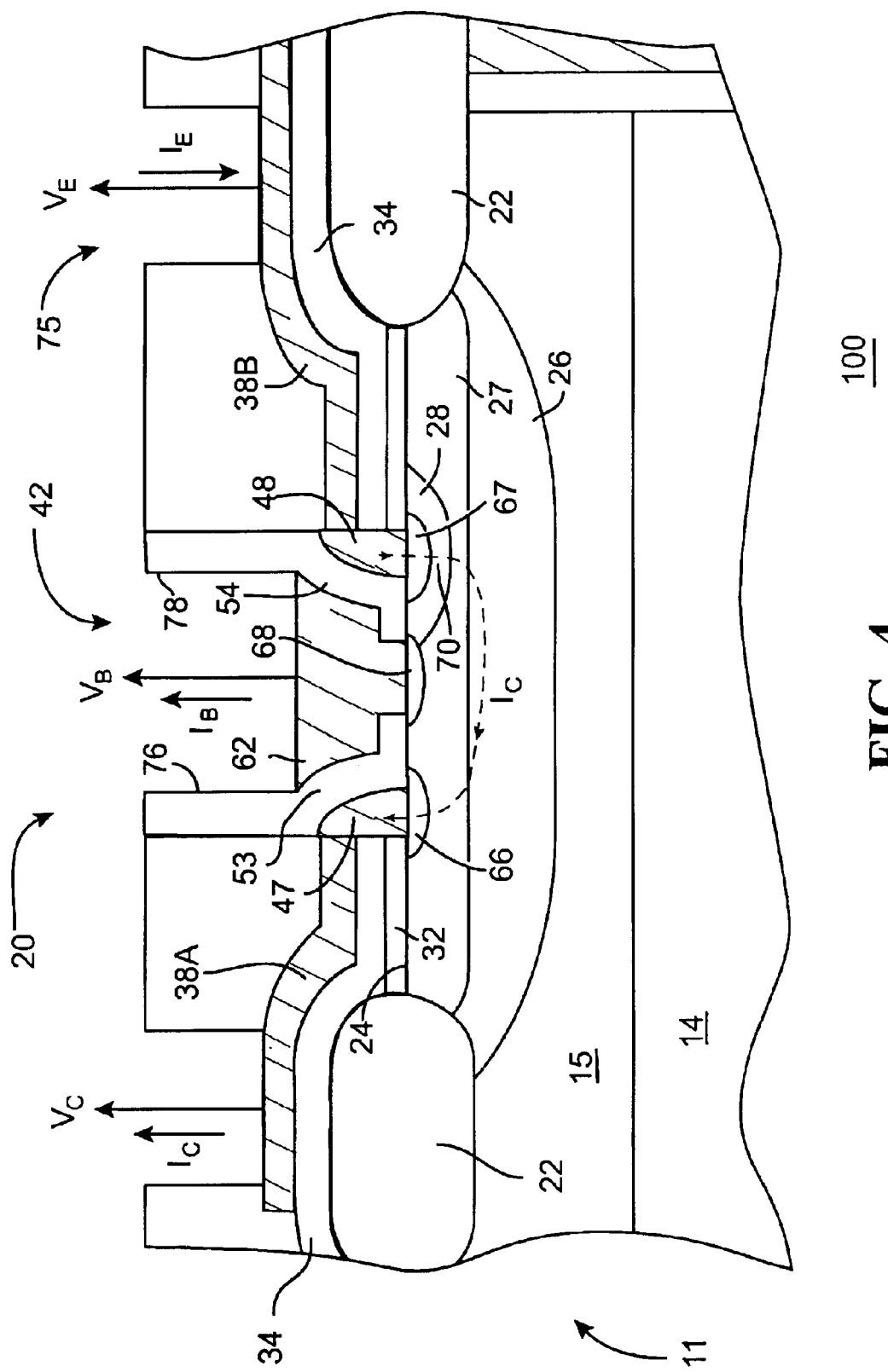
FIG. 4 is a cross-sectional view of the integrated circuit showing the detailed operation of a vertical PNP transistor.

FIG. 4 shows a cross-sectional view of integrated circuit 100 for describing details of the operation of vertical PNP transistor 20.

Assume that PNP transistor 20 is biased with an emitter voltage $V_E$=0.0 volts applied to emitter electrode 38B, a base voltage $V_B$=0.75 volts applied to base electrode 62 and a collector voltage $V_C$=2.0 volts applied to collector electrode 38A as shown. Since transistor 20 is a PNP transistor, its emitter base junction is forward biased to provide an emitter current $I_E$ that flows through emitter electrode 38B and spacer 48 into emitter 67. In one embodiment, the indicated biasing voltages produce an emitter current $I_E$ of about ten microamperes.

Emitter current $I_E$ flows vertically across an intrinsic base region 70 as shown and splits into a small base current $I_B$ and a collector current $I_C$. Base current $I_B$ flows from base region 28 through base contact region 68 and base electrode 62, while collector current $I_C$ flows through shallow collector region 27 and deep collector region 26 and through collector contact region 66, spacer 47 and collector electrode 38A as shown.

Since PNP transistor 20 is a vertical transistor, the effective base width of transistor 20 is the effective width of intrinsic base region 70, which is determined by the difference in junction depths of emitter region 67 and base region 28. Hence, the width of intrinsic base region 70 can be made narrow and can be well-controlled over a variety of standard processing variations. For example, in one embodiment, the width of intrinsic base region 70 is about 0.1 micrometers. The high level of control over the base width results in a high manufacturing yield and low cost, while achieving a high performance.

The high performance resulting from the narrow effective base width is indicated by a low base transit time and high frequency response. The narrow base width also provides a higher current gain, $h_{FE}=I_C/I_B$, for transistor 20 than what can be achieved with lateral devices that rely on photolithography to define the effective base width. In one embodiment, the current gain $h_{FE}$ of PNP transistor 20 is about one hundred, so that $I_B=0.1$ microamperes, approximately, and $I_C=9.9$ microamperes, approximately, when $I_E=10.0$ microamperes.

In summary, the present invention provides a semiconductor device suitable for formation as an integrated circuit that includes complementary bipolar NPN and PNP vertical transistors. A high performance NPN transistor is formed on a semiconductor substrate that has a surface doped to form a base region of a PNP transistor. A film is formed on the surface with an opening over an edge of the base region, and a first conductive spacer is formed along a first sidewall of the opening to define a PNP emitter region within the base region. A second conductive spacer formed along a second sidewall of the opening to define a PNP collector region. Both the NPN and PNP transistors have a high current gain and frequency response and can be fabricated with a high yield and low cost.

What is claimed is:

1. An integrated circuit, comprising:

a substrate having a surface doped to form a first base region;

a film formed on the surface with a first opening over an edge of the first base region;

a first conductive spacer formed along a first sidewall of the first opening to define a first emitter region within the first base region,
wherein the first conductive spacer electrically contacts the first emitter region formed within the first base region;

a second conductive spacer formed on the surface along a second sidewall of the first opening to define a first collector region of the integrated circuit,
wherein the second conductive spacer electrically contacts the first collector region formed in the substrate outside the first base region,
wherein the first emitter, first collector and first base regions operate as a PNP transistor,
wherein the first base region is doped to have a first conductivity type and the first emitter and first collector regions are doped to have a second conductivity type,
wherein the film includes conductive layer having a first portion for contacting the first conductive spacer at the first sidewall and a second portion for contacting the second conductive spacer along the second sidewall,
wherein the film is formed with a second opening over a second base region formed in the semiconductor substrate to have the first conductivity types;

a first semiconductor material disposed in the first opening between the first and second conductive spacers for contacting the first base region; and first and second dielectric spacers formed to electrically isolate the first and second conductive spacers from the first semiconductor material.

2. The integrated circuit of claim 1, further comprising an NPN transistor formed with a base region that includes silicon germanium.

3. The integrated circuit of claim 1, wherein the conductive layer is formed with a second semiconductor material.

4. The integrated circuit of claim 3, wherein the second semiconductor material comprises polycrystalline silicon doped to have the second conductivity type.

5. The integrated circuit of claim 1, further comprising a third conductive spacer formed on the surface along a first sidewall of the second opening for contacting the second base region.

6. The integrated circuit of claim 5, wherein the film has a third opening for contacting a second collector region.

7. The integrated circuit of claim 5, further comprising a third dielectric spacer formed adjacent to the third conductive spacer to define a second emitter region within the second base region.

8. The integrated circuit of claim 7, wherein a first portion of the semiconductor material is disposed in the first opening and a second portion of the semiconductor material is disposed in the second opening for contacting the second emitter region.

* * * * *